(12) United States Patent
Feuerbaum (10) Patent No.: US 7,652,263 B2
(45) Date of Patent: Jan. 26, 2010

(54) FOCUSSING LENS FOR CHARGED PARTICLE BEAMS

(75) Inventor: Hans-Peter Feuerbaum, Munich (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 274 days.

(21) Appl. No.: 10/587,137

(22) PCT Filed: Jan. 21, 2005

(86) PCT No.: PCT/EP2005/000598

§ 371 (c)(1),
(2), (4) Date: Apr. 16, 2007

(87) PCT Pub. No.: WO2005/071708

PCT Pub. Date: Aug. 4, 2005

(65) Prior Publication Data

US 2007/0262255 A1 Nov. 15, 2007

(30) Foreign Application Priority Data

Jan. 21, 2004 (EP) ............................. 04001221

(51) Int. Cl.
*H01J 37/28* (2006.01)
(52) U.S. Cl. .................. 250/396 R; 250/311; 250/310; 250/306; 250/492.3; 250/492.1
(58) Field of Classification Search ............. 250/310, 250/396 R, 397, 396 ML, 306, 307, 309, 250/311, 492.1, 492.2, 492.3
See application file for complete search history.

(56) References Cited

U.S. PATENT DOCUMENTS

| 4,596,929 | A | * | 6/1986 | Coates et al. | 250/310 |
| 5,668,372 | A | * | 9/1997 | Iwabuchi et al. | 250/310 |
| 5,677,530 | A | * | 10/1997 | Sato et al. | 250/310 |
| 5,734,164 | A | * | 3/1998 | Sanford | 250/310 |
| 6,037,589 | A | * | 3/2000 | Yonezawa et al. | 250/310 |
| 6,504,164 | B2 | | 1/2003 | Yonezawa et al. | |
| 6,855,938 | B2 | * | 2/2005 | Preikszas et al. | 250/396 R |
| 6,897,442 | B2 | * | 5/2005 | Petrov | 850/9 |
| 7,034,297 | B2 | * | 4/2006 | Petrov et al. | 250/310 |

(Continued)

FOREIGN PATENT DOCUMENTS

EP 0 732 726 9/1996

(Continued)

OTHER PUBLICATIONS

PCT International Search Report and Written Opinion dated Sep. 26, 2005, for PCT/EP2005/000598.

*Primary Examiner*—David A Vanore
*Assistant Examiner*—Michael J Logie
(74) *Attorney, Agent, or Firm*—Patterson & Sheridan, L.L.P.

(57) ABSTRACT

A focussing lens for focussing a charged particle beam onto a specimen at a predetermined landing angle. The focussing lens comprises at least one first electrode having a first aperture to generate a focussing electric field for focussing the charged particle beam onto the specimen and a correcting electrode having a curved surface to compensate for landing angle dependent distortions of the focussing electric field caused by the specimen. With the curved surface of the correcting electrode, it is possible to improve the focussing of a charged particle beam at landing angles that differ from the perpendicular landing angle.

23 Claims, 6 Drawing Sheets

U.S. PATENT DOCUMENTS

| | | |
|---|---|---|
| 7,233,008 B1 * | 6/2007 | Petrov et al. ........... 250/396 ML |
| 2001/0011702 A1 * | 8/2001 | Yonezawa et al. ........... 250/283 |
| 2002/0125428 A1 * | 9/2002 | Krans ......................... 250/311 |
| 2004/0000640 A1 | 1/2004 | Kazumori |
| 2004/0084629 A1 * | 5/2004 | Preikszas et al. ........ 250/396 R |
| 2006/0049348 A1 * | 3/2006 | Petrov et al. ................. 250/307 |

FOREIGN PATENT DOCUMENTS

| | | |
|---|---|---|
| EP | 0 762 468 | 3/1997 |
| WO | WO 02/37523 | 5/2002 |

\* cited by examiner

# FOCUSSING LENS FOR CHARGED
PARTICLE BEAMS

FIELD OF THE INVENTION

The invention relates to a focussing lens for focussing a charged particle beam, in particular for electron beams of electron microscopes or ion beams of focussing ion beam devices.

BACKGROUND OF THE INVENTION

Charged particle beam devices like electron microscopes, focussed ion beam devices, or electron beam pattern generators are required to deliver an ever increasing spatial resolution for inspecting or structuring specimens like semiconductor wafers, masks, biological specimens, and the like. A high spatial resolution can only be achieved if the focus spot size of the charged particle beam is made sufficiently small. Focussing a charged particle beam to a small spot size, however, requires a tight control of the focussing electric and/or magnetic fields.

Unfortunately, in practice, any conducting component nearby the charged particle beam may be a source for distorting a focussing electric field. Therefore, whenever a component nearby the charged particle beam is moved with respect to the beam during operation, the focussing quality of the charged particle beam source may suffer.

Focussing electric field distortions also occur when the specimen itself is moved. This situation arises when, e.g., the charged particle beam device is used to inspect or structure a specimen at different landing angles. The landing angle refers to the angle between the inspected or structured surface of the specimen and the direction of the incoming (primary) charged particle beam. Inspecting a specimen at different landing angles may significantly increase information on the surface of the specimen, like surface topology, chemical surface structure, etc.

Figure 1A:
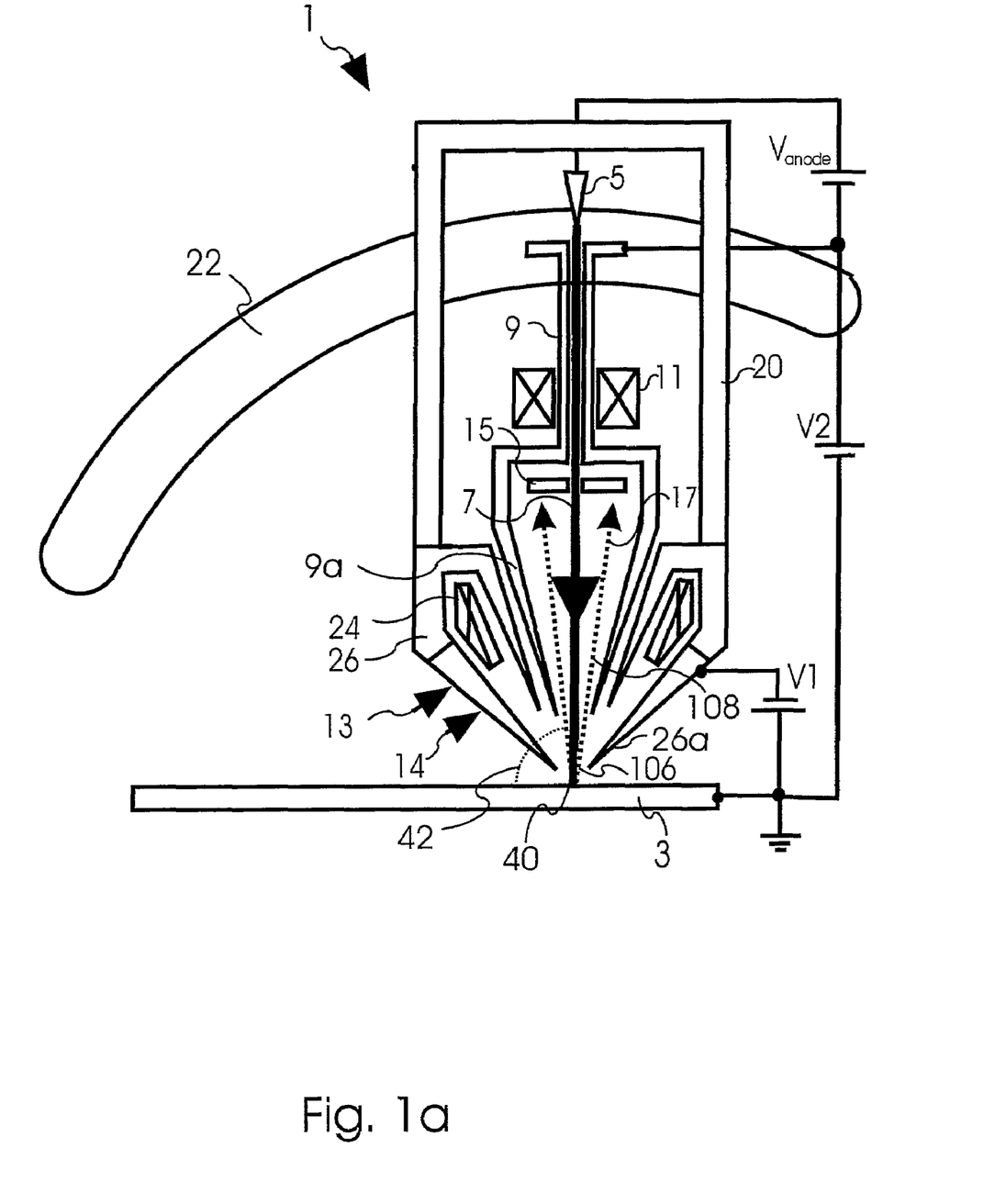
FIG. 1a Scanning Electron Microscope (SEM) known in the art having a cone-like shaped focussing lens and operated at a vertical landing angle to inspect a semiconductor wafer.
Figure 1B:
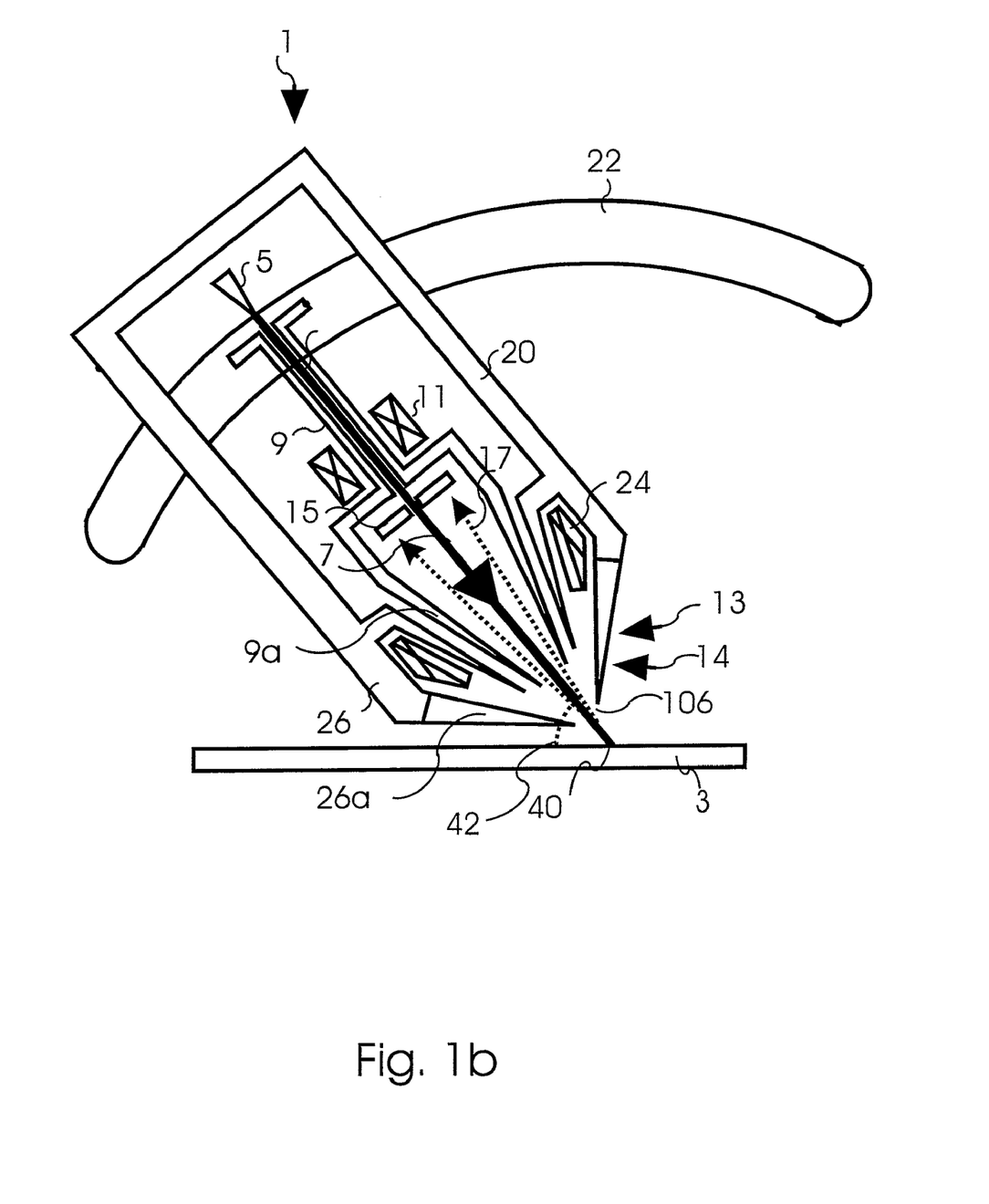
FIG. 1b Scanning Electron Microscope (SEM) of FIG. 1a being tilted to inspect the wafer at a landing angle of 45 degrees.

Usually, the landing angle is adjusted by means of some tilting mechanism which tilts the charged particle beam device with respect to the surface of the specimen. FIGS. 1a and 1b illustrate an example where a semiconductor wafer 3 is inspected by a scanning electron microscope 1 (SEM) at two different landing angles 42. In FIG. 1a, the specimen 3 is inspected at a first landing angle 42 of 90 degrees, while in FIG. 1b, the specimen is inspected at a second landing angle 42 of 45 degrees. Note that, while in FIG. 1a-b the SEM 1 becomes tilted in order to obtain a tilted landing angle, other types of SEMs use a set-up where the specimen becomes tilted in order to obtain a tilted landing angle.

The SEM 1 of FIGS. 1a and 1b is comprised of a beam tube 20 having an electron beam source 5, e.g. a thermal field emission cathode, to generate an electron beam 7, a high voltage beam tube 9 to accelerate the electron beam 7 up to an energy controlled by an anode voltage $V_{anode}$, a condenser 11 to improve the electron beam shape, a magnetic focussing lens 13 and an electrostatic focussing lens 14 to focus the electron beam 7 onto the wafer 3. The SEM 1 of FIG. 1a and 1b further comprises an in-lens detector 15 to detect and evaluate the signal of the secondary charged particles 17 which are generated by the primary electron beam 7 on the wafer 3.

The magnetic focussing lens 13 of FIG. 1a and 1b consists of a coil 24 and a yoke 26 shaped to generate a focussing magnetic field for the primary electron beam 7. The electrostatic focussing lens 14 of FIG. 1a and 1b is comprised of the lower-end elements 9a of the high voltage beam tube 9, the cone-like shaped elements 26a ("conical cap") of yoke 26, and apertures 106 at the apices of the respective elements. The focussing electric field is defined by the geometry of the lower-end element 9a, of the conical cap, their apertures 106 and by the voltages V1 and V2 between the wafer 3 and, respectively, the conical cap 26a and the high voltage beam tube 9 (for simplicity of the drawings, the voltages V1, V2 and $V_{anode}$ are only shown in FIG. 1a). As it turns out, if the electric field between the conical cap 26a and wafer 3 is adjusted in such a way that it decelerates the primary electron beam 7, the spatial resolution of the probing primary electron beam can be increased when combined with a magnetic focusing field. More details about the combined electrostatic and magnetic focussing lens, and about the SEM of FIG. 1a in general, can be found in "*High Precision electron optical system for absolute and CD-measurements on large specimens*" by J. Frosien, S. Lanio, H. P. Feuerbaum, Nuclear Instruments and Methods in Physics Research A, 363 (1995), pp. 25-30.

In FIG. 1b, the beam tube 20 is tilted by 45 degrees with respect to the wafer 3 to inspect the wafer 3 at a second landing angle 42 of 45 degrees. In the case of FIGS. 1a and 1b, a controlled tilting has been realized by a tilting mechanism 22 which enables the SEM to inspect any location on the wafer at (at least) two different landing angles 42. Further, due to the cone-like shaped elements 26a of the yoke 26, it is possible to tilt the SEM while maintaining a short working distance between the focussing lens 14 and the specimen 3, as can be seen from FIG. 1b. The cone-like shape of the cone-like shaped elements 26a of the yoke 26 prevents the beam tube 20 from touching or scratching on the specimen 3 when tilted, without having to give up on the short working distance.

The charged particle beam device of FIGS. 1a and 1b allows for an inspection of a specimen at different predetermined landing angles. However, as it turns out, changing the landing angle away from a perpendicular direction can severely reduce the spatial resolution of a charged particle beam device.

SUMMARY OF THE INVENTION

It is therefore a first aspect of the present invention to provide a focussing lens with an improved spatial resolution for inspecting or structuring a specimen.

It is yet a further aspect of the present invention to provide a focussing lens which provides a high spatial resolution even if the landing angle of the charged particle beam onto the surface of a specimen significantly deviates from 90 degrees.

It is yet a further aspect of the present invention to provide a focussing lens capable of providing a superior focus for charged particle beams having varying landing angles.

It is also an aspect of the present invention to provide a charged particle beam device with a focussing lens that is capable of providing a high spatial resolution at various landing angles.

In particular, it is an aspect of the present invention to provide a charged particle beam device with a combined electrostatic and magnetic focussing lens that is capable of providing a high spatial resolution at various landing angles.

This and other advantages are achieved by the focussing lenses, the charged particle beam device, and the methods of inspecting or structuring a specimen by means of a charged particle beam according to the present invention.

Further advantages, features, aspects, and details of the invention are evident from the description and the accompanying drawings.

The invention includes a focussing lens for focussing a charged particle beam onto a specimen at a predetermined landing angle comprising at least a first electrode having a first aperture to generate a focussing electric field for focussing the charged particle beam onto the specimen, and a correcting electrode having a curved surface to compensate for landing angle dependent distortions of the focussing electric field caused by the specimen.

With the correcting electrode having a curved surface, it is possible to improve the rotational symmetry of the focussing electric field in the region between the at least one first electrode and the specimen if the specimen is tilted with respect to the incoming charged particle beam. This improves the capability of the focussing lens to focus the primary charged particle beam onto a tilted specimen and, therefore, may lead to an improved spatial resolution.

The present invention is based on the observation that changing the landing angle can decrease the spatial resolution. Further, the present invention is based on the realization that a reduction of the spatial resolution is due to a distortion of the focussing electric field when tilting the specimen with respect to the focussing lens. Further, the present invention is based on the idea to compensate the distortions of the focussing electric field by introducing a correcting electrode. Further, the present invention is based on the idea of having the correcting electrode comprising a curved surface in order to compensate for the landing angle dependent distortions of the focussing electric field.

With a curved surface, the correcting electrode is capable of shaping the focussing electric field in a more rotationally symmetric way. Preferably, the curved surface of the correcting electrode is cone-like shaped. The term "cone-like shaped" refers to a shape that can be a segment of the jacket of a cone. With a cone-like shaped correction electrode, it is possible to provide a superior rotational symmetry of the focussing electric field when the specimen is tilted with respect to the symmetry axis of the focussing lens.

Preferably, the curved surface of the correcting electrode has an opening on one side to provide space for the specimen to approach the at least one first electrode in the region of the opening. This can be used to reduce the working distance when the specimen is tilted. The smaller the working distance for inspecting or structuring the specimen is, the higher a spatial resolution can be achieved. The working distance usually refers to the distance between the first electrode and the surface of the specimen.

In particular, if the curved surface is cone-like shaped, the opening on the side of the curved surface of the correcting electrode reaches from the apex to the base of the cone. In this case, a specimen with a surface larger than the opening, like a semiconductor wafer, can be positioned closer to the at least one first electrode than without such an opening.

Preferably, the curved surface of the correcting electrode is shaped and positioned to encircle the symmetry axis of the at least one electrode only partially. In this case, the region not encircled by the curved surface preferably represents an opening on one side of the curved surface that can provide an access for a specimen to closer approach the at least one first electrode. Further, as it turns out, correcting electrodes that only partially encircle the symmetry axis can provide a superior compensation for landing angle dependent distortions, compared to electrodes that fully encircle the symmetry axis.

Preferably, the curved surface of the correcting electrode is shaped and positioned to encircle the symmetry axis by a covering angle of at most up to 350 degrees, preferably of at most up to 300 degrees and, even more preferred, of at most up to 210 degrees. Preferably, the covering angle is given by the angle covered by the correcting electrode as seen from the symmetry axis in a plane parallel to the first aperture of the at least one first electrode. The smaller the covering angle the larger the opening can be made in order to minimize the working distance for inspecting or structuring a tilted specimen.

On the other side, it is preferred that the curved surface of the correcting electrode is shaped and positioned to encircle the symmetry axis by a covering angle of at least 10 degrees, preferably of at least 60 degrees and, even more preferred, of at least to 180 degrees. The larger the covering angle, the better the shielding of the focussing electric field against distortions caused by a tilted specimen. Preferably, the covering angle is taken within the plane of the first aperture.

Further, preferably, the curved surface of the correcting electrode is shaped and positioned to be asymmetric with respect to a rotation by 180 degrees around the symmetry axis. With a rotationally asymmetric correcting electrode, it is possible to compensate for electric field distortions that result from a specimen whose surface is tilted with respect to the incoming charged particle beam.

However, it is preferred that the at least first electrode and the curved surface of the correcting electrode are shaped and positioned to be symmetric with respect to a same symmetry plane. Preferably, the symmetry plane is identical with the plane within which the focussing lens is tilted for inspecting or structuring the specimen. This geometry is a particularly efficient way to compensate for distortions of the focussing electric field that are caused by a tilting of the focussing lens with respect to the specimen.

Preferably, the at least one first electrode is cone-like shaped. In this case it is preferred that the curved surface of the correcting electrode is shaped and positioned to cover some outer portion of the cone-like shaped first electrode when seen from the outside of the focussing lens. This way, the correcting electrode can electrostatically shield the first electrode from external electric fields which may introduce distortions into the focussing electric field of the focussing electric field. Further this way, the correcting electrode can be used to actively compensate electric field distortions which are introduced into the focussing electric field from a side of the first electrode which is not covered by the correcting electrode. Preferably, the compensation is carried out by adjusting the correction electrode voltage VC in a way that optimizes the focus spot size.

In particular, if operating the focussing lens at a tilted landing angle, it is preferred that the portion of the cone-like shaped first electrode that is covered by the correcting electrode, is opposite to the portion of the cone-like shaped first electrode that is closest to the specimen. This way, the portion of the cone-like shaped first electrode not covered by the correcting electrode can be seen as being "covered" by the specimen. In this configuration, the potentials of the specimen and the correcting electrode can be balanced to minimize the electric field distortions introduced by the tilting of the specimen and/or the focussing lens. In this case, specimen and the curved surface of the correcting electrode can provide a common electrostatic shield that provides a potential that minimizes the electric field distortions caused by the specimen. In this way, the specimen becomes part of the electrode structure helping to optimize the focussing quality of the charged particle beam.

Further, with the specimen being part of the electrode structure that defines the focussing electric field for focussing the charged particle beam, the specimen can be moved very closely to the cone-like shaped first electrode. This helps to keep the working distance in the tilted beam configuration short.

The present invention also refers to a charged particle beam device which includes a charged particle beam source and a focusing lens. The charged particle beam device with the focussing lens is capable of inspecting or structuring a specimen at landing angles that deviate from 90 degrees with high spatial resolution.

Preferably, the charged particle beam device according to the invention includes a tilting mechanism by which the optical axis of the focussing lens can be tilted with respect to the surface of the specimen or vice versa. This enables the charged particle beam device to observe or structure the specimen at different landing angles, which expands the range of application or improves the precision for inspecting or structuring the specimen.

Preferably, the tilting plane of the charged particle beam device is essentially equal with the symmetry plane of the curved surface of the correcting electrode of the focussing lens. In this case, the curved surface of the correcting electrode can best compensate for landing angle dependent distortions of the focussing electric field to improve the focussing quality of the charged particle beam.

The present invention also refers to a method of inspecting or structuring a specimen by means of a charged particle beam which includes the steps of providing a charged particle beam device having a correcting electrode; inspecting or structuring the specimen at a first landing angle at a first correcting electrode voltage applied to the correcting electrode; and inspecting or structuring the specimen at a second landing angle at a second correcting electrode voltage applied to the correcting electrode.

Operating the charged particle beam device at different landing angles and at different correcting electrode voltages makes it possible to inspect or structure the specimen at a high spatial resolution independent of the respective different landing angles. Preferably, the first landing angle is adjusted to be in the range between 70 degrees and 110 degrees, preferably between 80 degrees and 100 and even more preferred between 85 degrees and 95 degrees with respect to the surface of the specimen. The closer the landing angle is to 90 degrees, the higher a rotational symmetry can be provided for the charged particle beam approaching the specimen.

Generally it is preferred that second landing angle is in the range between 20 degrees and 70 degrees, preferably between 30 degrees and 60 and even more preferred between 40 degrees and 50 degrees with respect to the surface of the specimen. Landing angles within these ranges facilitate a charged particle beam operation that can provide complementary information of the specimen, in addition to the information obtained by probing at the first landing angle. Further, if the first electrode is cone-like shaped, it is preferred that the second landing angle is adjusted to be about equal to half of the vertex angle defined by the cone-like shaped first electrode. This way, the region of the cone-like shaped electrode closest to the specimen runs essentially in parallel to the surface of the specimen. This makes the use of a correcting electrode for improving the rotational symmetry particularly effective.

Preferably, the first correcting electrode voltage is adjusted to be equal to the specimen voltage Vs or within the range defined by the voltages between the specimen voltage Vs and the first electrode voltage V1 applied to the first electrode. A correcting electrode at such voltages minimizes its deforming effect on the rotational symmetry of the electric focussing field when the charged particle beam is operated at a landing angle of 90 degrees.

Further, preferably, the second correcting electrode voltage is adjusted to be outside of the range defined by the voltages between the specimen voltage Vs and the first electrode voltage V1 applied to the first electrode. A correcting electrode at such voltages can be used to compensate for deformations of the rotational symmetry of the electric focussing field due to a tilting of the charged particle beam with respect to the surface of the specimen.

In particular, it is preferred that the second correcting electrode voltage is adjusted to a value of about 2*Vs−V1, with a tolerance of less than 50 percent, preferably of less than 20 percent, and even more preferred of less than 10 percent. In this formula, Vs represents the voltage of the specimen and V1 the voltage of the first electrode. With such second correcting electrode voltage, a very high compensation for deformations of the rotational symmetry of the focussing field can be achieved if the first electrode is cone-like shaped and the second landing angle is adjusted to be about equal to half of the vertex angle defined by the cone-like shaped first electrode.

Further, it is preferred that the first and/or second landing angles are adjusted by means of a tilting mechanism that is part of the charged particle beam device. This way, it is possible to inspect or structure the specimen at different landing angles at a high speed. In particular, this way, it is possible to inspect the specimen at different landing angles without having to break the vacuum that may surround the charged particle beam.

The present invention also refers to a method of inspecting or structuring a specimen by means of a charged particle beam which includes the steps of providing a charged particle beam device having at least a first electrode and a correcting electrode; inspecting or structuring the specimen at a first landing angle with the correcting electrode at a first position with respect to the at least first electrode; and inspecting or structuring the specimen at a second landing angle with the correcting electrode at a second position with respect to the at least first electrode.

By varying the position of the correcting electrode with respect to the first electrode, it is possible to move the correcting electrode away from the charged particle beam. This way, it is possible to fully restore the rotational symmetry of the electric focussing field if the landing angle is 90 degrees with respect to the surface of the specimen. Further this way, no adjustment of the voltage of the correcting electrode is necessary. When moving the correcting electrode away from the first electrode, it is preferred that the distance between the second position and the first electrode is larger than the distance between the first position and the first electrode by a factor of at least two, preferably at least 10, and even more preferred by at least 100.

BRIEF DESCRIPTION OF THE DRAWINGS

Some of the above indicated and other more detailed aspects of the invention will be described in the following description and partially illustrated with reference to the figures. Therein:

FIG. 4 3-dimensional schematic drawing of an focussing lens according to the invention showing a cone-like shaped first electrode covered by the correcting electrode, as shown in FIG. 3A to 3D.

DESCRIPTION OF THE PREFERRED EMBODIMENTS

In the description of the detailed embodiments according to the invention below, the numbers refer to the enclosed figures FIGS. 1a and 1b, FIGS. 2a and 2b, FIGS. 3A, 3B, 3C and 3D and to FIG. 4. The figures in the figures only represent particular, non-limiting embodiments of the invention which have the purpose of being only illustrative examples of the invention. The description below, even though it makes reference to the figures, is to be understood in a broad sense and includes any deviation from the described embodiments which is obvious to a person skilled in the art. The term "focussing lens" refers to any lens that is capable of providing a focussing electric field for focussing a beam of charged particles like, e.g. an electron beam or an ion beam, onto a specimen. The term "focussing lens" also includes lenses which are combined with means providing a magnetic focussing field.

The focussing of a charged particle beam according to the invention can be realized in many different ways. For example, the focussing may be effected by a first electrode having a first aperture that faces the surface of a specimen. If a first electrode voltage V1 is applied between the first electrode and the specimen, potential lines form at the first aperture that generate a focussing electric field for a charged particle beam that passes through the first aperture towards the specimen. In this configuration, the specimen and first electrode form a lens also known as "aperture lens". The focus length of the focussing lens depends on the diameter of the aperture, the size of the first electrode voltage V1 and the energy of the particles of the charged particle beam. Persons skilled in the art know how to design and operate aperture lenses, independent of whether the first and second electrodes are flat, conic or otherwise shaped.

In another example, the focussing according to the invention may be effected by a first electrode and a second electrode both having a first and a second aperture, respectively, through which the charged particle beam travels towards the specimen. In this case, if a first voltage V1 with respect to the specimen is applied to the first electrode and a different second voltage V2 with respect to the specimen is applied to the second electrode, potential lines may form between the first electrode and the second electrode that focus a charged particle beam. In this configuration, the first electrode and the second electrode together act as a lens which is known as "immersion lens". Preferably, the first and the second electrodes are coaxially aligned with respect to each other in order to provide for good focussing, i.e. to obtain a small focus spot size. Again, persons skilled in the art know how to design and operate aperture lenses, independent of whether the first and second electrodes are flat, conic or otherwise shaped.

In a third example, the focussing according to the invention may be effected by a first electrode and a second electrode, both having a first and a second aperture, respectively, through which the charged particle beam travels towards the specimen. In addition, the focussing is also enforced by a magnetic dipole magnet that produces a focussing magnetic field overlying the focussing electric field. An example of such a combined magnetic electrostatic lens is shown in FIG. 1a and the description thereof in the introduction.

The three examples of a focussing lens are to demonstrate some of the ways by which an at least first electrode with a first aperture can generate a focussing electric field for focussing a charged particle beam. A person skilled in the art will know that there are many other ways to focus a charged particle beam which would all be applicable for the present invention. In particular, the focussing lens may include focussing means that include a third, fourth or even more electrodes in addition to the mentioned first and a second electrodes.

The landing angle according to the invention relates to the angle at which the incoming charged particle beam impinges onto the specimen. Further, in all of the discussions of the present description, a "tilted angle" or a "tilted" operation refer to an operation of the focussing lens where the landing angle of the charged particle beam deviates significantly from 90 degrees.

In many charged particle beam applications, the landing angle usually is 90 degrees, i.e. the charged particle beam impinges onto the specimen at a vertical direction. In this case, the electrical potential along the surface of the specimen is rotationally symmetric with respect to the axis of the incoming beam which, as it turns out, usually provides the best focussing quality. However, when tilting the focussing lens with respect to the specimen or vice versa, the distribution of the electric potential on the surface of the tilted specimen is not rotationally symmetric anymore with respect to the axis of the incoming charged particle beam. This causes the focussed charged particle beam spot size to increase and, as a consequence, the spatial resolution of a charged particle beam device to decrease.

FIGS. 2a and 2b, FIG. 3A, 3B, 3C, 3D and FIG. 4 illustrate a preferred embodiment of the focussing lens 100, which, for example, could be part of the SEM of FIGS. 1a-b as a replacement for the electrostatic focussing lens 14.

Figure 2A:
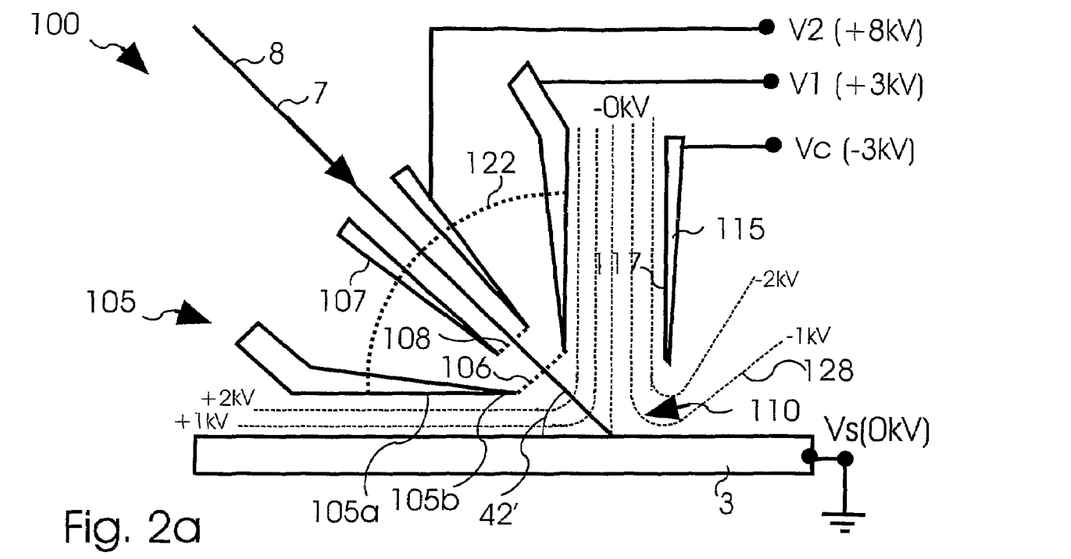
FIG. 2a Focussing lens according to the invention being tilted to inspect a wafer at a landing angle at 45 degrees.
Figure 2B:
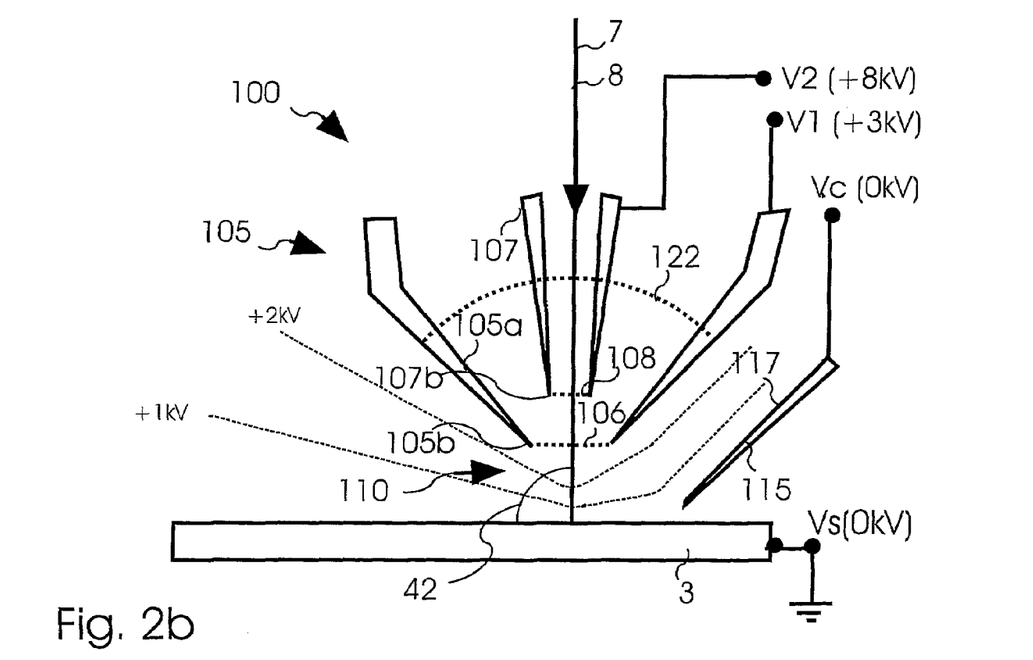
FIG. 2b Focussing lens of FIG. 2a being at a vertical position to inspect the wafer at a vertical landing angle.

FIGS. 2a-b show a schematic cross section through the focussing lens 100 during operation for focussing a charged particle beam 7 onto a specimen 3 at two different landing angles 42. In FIG. 2a, the landing angle 42 is 45 degrees, while in FIG. 2b, the landing angle is 90 degrees. The cut plane of the cross sections of FIGS. 2a-b is chosen to be the tilting plane within which the focussing lens 100 is tilted in FIGS. 2a-b.

Further, only for demonstration, the primary charged particle beam 7 in FIGS. 2a-b is an electron beam; however, the focussing lens 100 would work for an ion beam or any other charged particle beam as well. Further, again only for demonstration, the specimen 3 in FIGS. 2a and 2b is a semiconductor wafer; however, the specimen could also be any other device, like, e.g., a photolithographic mask or a biological specimen.

The focussing lens 100 of FIG. 2a-b is comprised of a first electrode 105 and a second electrode 107 both being electrically connected to a respective first and second voltage V1 and V2. The first electrode 105 is cone-like shaped and has a rim 105b at its apex that forms a first aperture 106. The shape of the first aperture 106 defines a symmetry axis 8 which, in the case of FIGS. 2a-b, essentially coincides with the path of the primary electron beam 7. It also coincides with the optical axis of the electrostatic lens 100. Further, in the example of FIGS. 2a-b, the first cone vertex angle 122 of the cone-like shaped first electrode 105a is 90 degrees; however, any other cone vertex angle 122 between 0 degrees and 180 degrees would work as well for the present invention.

The second electrode 107 is essentially tube-shaped thereby providing a second aperture 108 having a rotational symmetry axis which essentially coincides with the symmetry axis 8 of the first aperture 106, with the path of the primary electron beam 7, and with the optical axis of the electrostatic lens 100. Note that the second electrode 107 could also be cone-like shaped.

It should be noted that the cone vertex angle 122 of the first electrode is mainly chosen for space reasons due to the limited working distance between the specimen 3 and the first aperture 106. For example, in the example of FIGS. 2a-b, the cone vertex angle 122 is chosen to be 90 degrees in order to allow for a convenient operation of the charged particle beam 7 at both, a 45 degrees landing angle 42 (see FIG. 2a) and a 90 degrees landing angle 42 (see FIG. 2b) at about the same short working distance. With a cone vertex angle 122 larger than 90 degrees, e.g., it would not be possible to tilt the focussing lens 100 by 45 degrees at the same working distance without the focussing lens 100 touching or scratching on the specimen 3.

It should further be noted that the cone-like shape allows for a design where the first electrode 105 is combined with the yoke 26 of a magnetic focussing lens 13, as was shown in FIG. 1a. Combined electrostatic-magnetic lenses with and without a conic shape are also shown in FIG. 1 and FIG. 2 of U.S. Pat. No. 4,831,266 and the description thereof, which herewith is enclosed within the description. FIG. 2 of U.S. Pat. No. 4,831,266 also illustrates the way in which a high voltage beam tube 9 is implemented into the focussing lens 100, thereby helping to improve the focus quality for low energy electron microscopy.

Figure 3A:
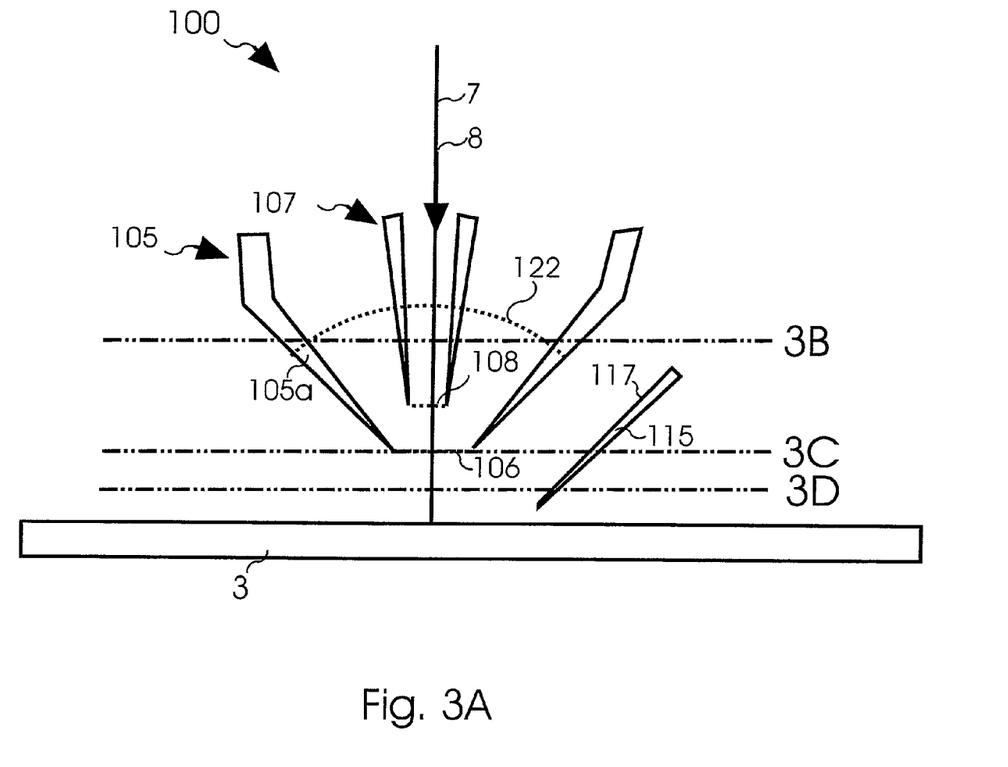
FIG. 3A Cross section through the focussing lens of FIG. 2a indicating the cross section lines 3B, 3C, 3D.
Figure 3B:
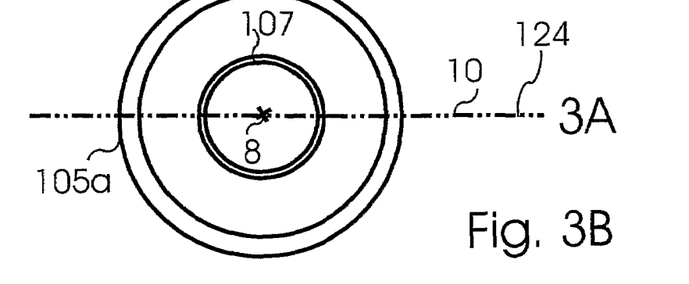
FIG. 3B Cross section along the cross section line 3B of FIG. 3A through second electrode and cone-like shaped first electrode.
Figure 3C:
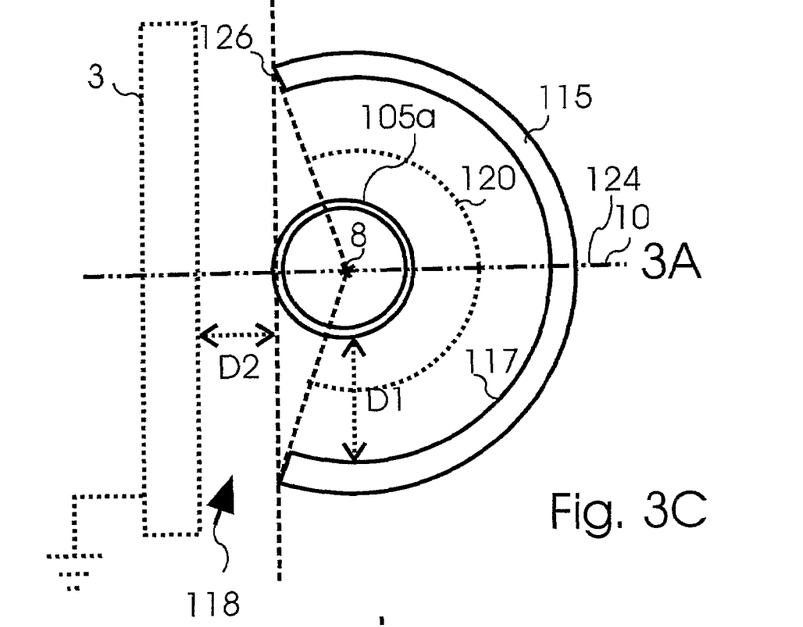
FIG. 3C Cross section along the cross section line 3C of FIG. 3A through correcting electrode and cone-like shaped first electrode.
Figure 3D:
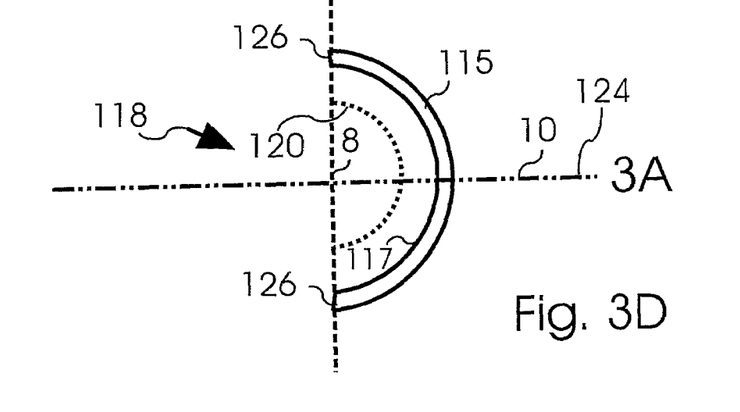
FIG. 3D Cross section along the cross section line 3D of FIG. 3A through the correcting electrode only.
Figure 4:
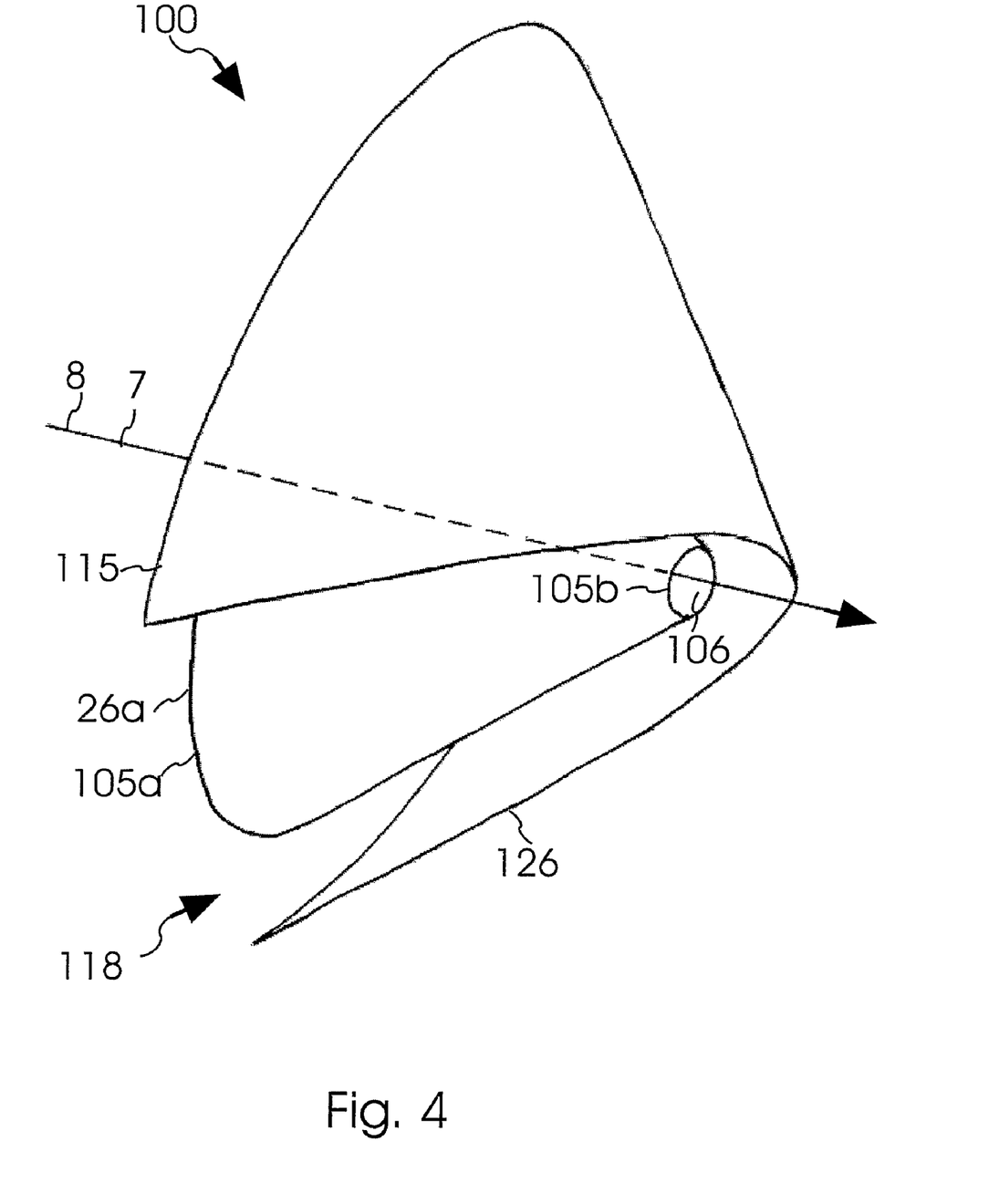

While cone-like shaped first electrode 105 and second electrode 107 exhibit a full rotational symmetry with respect to each other in order to generate a rotationally symmetric focussing electric field 110, the correcting electrode 115 does not, as can be seen from FIGS. 2a-b, FIG. 3A-C and FIG. 4. Rather, the shape of the curved surface 115 of the correcting electrode has an opening 118 limiting the extend to which the curved surface 115 encircles the symmetry axis 8 (see FIG. 3C-D and FIG. 4). The size of the opening 118 of FIG. 3C-D and FIG. 4 is large enough to position the cone-like shaped first electrode 105 closer to the wafer 3 than it would be the case without the opening 118, i.e. with the con-like shaped correcting electrode fully encircling symmetry axis 8. At the same time, the size of the opening 118 is small enough to provide sufficient shielding from external electric fields that would distort the rotational symmetry of the focussing electric field 110.

FIGS. 3A, 3B, 3C, 3D and FIG. 4 illustrate different cross sections of the focussing lens 100 of FIGS. 2a and 2b in planes perpendicular to symmetry axis 8. For a better understanding, the cut lines of the cross sections of FIGS. 3B, 3C and 3D are drawn in FIG. 3A as dashed lines 3B, 3C, 3D, and the cut line of the cross section of FIG. 3A is shown in the FIGS. 3B, 3C and 3D as a dashed line 3A. Further, cut line 3C runs within the plane of the first aperture 106 of the cone-like shaped first electrode 105, cut line 3B runs within a plane above the first aperture 106 and above the correcting electrode 115, and cut line 3D runs below the first aperture 106. Further, FIG. 4 schematically illustrates the cone-like shaped first electrode 105a and the correcting electrode 115 of the FIGS. 2a, 2b and FIGS. 3A-D in a three dimensional view.

The cone-like shaped first electrode 105 of FIGS. 3A-D and FIG. 4 is a cone having a an apex angle of 90 degrees and a cone height of a few millimeters. The apex of the cone-like shaped first electrode 105a is truncated to provide the first aperture 106 through which the primary charged particle beam 7 can pass towards a specimen 3. The cone-like shaped first electrode 105a can be, for example, the "conical cap" 26 of the yoke 26 shown in FIG. 1a-b. Further, the diameter of the first aperture 106 is between 1 to 6 mm, depending on the application.

The correcting electrode 115 of FIGS. 3A-D and FIG. 4 covers a significant region of the cone-like shaped first electrode 105 when seen from the outside of the focussing lens 100. The correcting electrode 115 is essentially cone-like, but it is recessed by an opening 118 that limits the extend to which the curved surface 115 of the correcting electrode encircles the symmetry axis 8. Note that the size and shape of the opening 118 is defined by the sizes of the covering angles 120 that define the angle covered by the correcting electrode 115 as seen from the symmetry axis 8 within a plane parallel to the plane of the first aperture 106 (see FIGS. 3A-D). Further, the covering angle 120 of the correcting electrode 115 within the plane of the first aperture 106 (see FIG. 3C) is typically larger than 180 degrees, while the covering angle 120 of the correcting electrode 115 at the cut line 3D below the plane of the first aperture 106 is 180 degrees and less (see FIG. 3D). This way, wafer 3 can be placed to the cone-like shaped first electrode 105a closer compared to the case where the correcting electrode 115 would fully encircle the symmetry axis 8. Detailed covering angle values depend on the respective detailed design of a given focussing lens and can be easily derived by a person skilled in the art.

With the shape of the correcting electrode 115 as shown in FIG. 2a-b, FIGS. 3A-D and FIG. 4, the rim 126 of the correcting electrode 115 that defines the shape of the opening 118 also defines a plane that extends essentially parallel with the specimen 3 when the focussing lens 100 is operated at a landing angle 42 of 45 degrees. This way, wafer 3 and correcting electrode 115 together can be positioned to form an enclosure for the cone-like shaped first electrode 105a (see FIG. 3C) that provides a focussing electric field 110 with a high degree of rotational symmetry. At the same time, the distance D2 between the specimen and the cone-like shaped first electrode 105a can be made smaller than the distance D1 between the cone-like shaped first electrode 105a and the correcting electrode 115 to the spatial resolution of the focussing lens. Note further that rim 126 of opening 118 in FIG. 4 essentially has the shape of a parabola. Further, the correcting electrode of FIG. 4 covers the cone-like shaped first electrode 105a by more than 40% to electrostatically shield the cone-like shaped first electrode 105a.

The cross section drawings of the FIGS. 2a-b and FIGS. 3A-D further demonstrate the coaxial alignment of the first electrode 105, the second electrode 107 and the correcting electrode 115 with respect to each other. Further, due to the same cone vertex angle 122 of the cone-like shaped first electrode 105a and the correcting electrode 115, the distance D1 between cone-like shaped first electrode 105a and the inner surface 117 is constant. In the present embodiment, the distance D1 is about 4 mm.

In the example of FIG. 2a, the second electrode 107 is at a second electrode voltage V2 of +8 kV (this voltage could be the voltage of the high voltage beam tube 9 of FIG. 1a), the first electrode 105 is at a first electrode voltage V1 of 3 kV, the correcting electrode 115 is at a correcting electrode voltage Vc of −3 kV and the wafer 3 is at ground potential (Vs=0V). Due to the 90 degrees cone vertex angles 122 of the cone-like shaped first electrode 105a and the correcting electrode 115, and due to a landing angle 42' of 45 degrees, the one side of the outer surface of the cone-like shaped first electrode 105a runs in parallel to the wafer 3, while the opposite side of the cone-like shaped first electrode 105a runs in parallel to the inner surface 117 of the correcting electrode 115. This way, the electrostatic potential lines 128 between the cone-like shaped first electrode 105a and wafer 3, or between the cone-like shaped first electrode 105a and the inner surface 117 of the correcting electrode 115, run in parallel to the respective surfaces (see FIG. 2a). As a result, potential lines 128 between the first aperture 106 and the wafer 3 are provided which at the position of the primary electron beam 7 are symmetric within the drawing plane of FIG. 2a. This symmetry greatly improves the focussing of the primary electron beam 7, compared to the case without the correcting electrode 115.

FIG. 2b shows the situation where the landing angle 42 is 90 degrees. In this case, the first voltage V1 of the first electrode 105 and the second voltage V2 of the second electrode 107 remain essentially the same as in FIG. 2a in order to direct the primary electron beam 7 with the same focal length onto the specimen 3. However, in FIG. 2b the correcting electrode voltage Vc has been changed significantly in order to restore the rotational symmetry of the focussing electric field 110 as good as possible. This is achieved by adjusting the correcting electrode voltage Vc to a voltage slightly more positive than the specimen voltage Vs of the specimen 3.

It is true that the symmetry of the potential lines 128 of FIG. 2a exhibits only a planar symmetry, and not a full rotational symmetry. Therefore, the focussing of the primary electron beam 7 may not be as good as with a focussing electric field with a full rotational symmetry with respect to symmetry axis 8. However, the planar symmetry provided by the correcting electrode 115 at a tilted operation represents a significant improvement for the focussing over the case where there is no correcting electrode at all.

It is also true that the presence of the correcting electrode 115 may distort the rotational symmetry of the focussing electric field 110 with respect to the symmetry axis 8 when the landing angle 42 of the primary electron beam 7 is perpendicular to the surface of the specimen 3. In this situation, however, an adjustment of the correcting electrode voltage Vc to a value where the distortion to the rotational symmetry of the focussing electric field 110 is minimized is possible. This way, the focussing of the primary electron beam 7 can be optimized for any landing angle 42 by adjusting the correcting electrode voltage Vc accordingly.

The values of the first voltages V1 of the first electrode 105, the second voltage V2 of the second electrode 107 and the correcting electrode voltage Vc of the correcting electrode 115 disclosed in FIG. 2a-b refer to a typical application of an SEM of the kind as shown in FIG. 1a. In this case, it is necessary that the first electrode 105 and the correcting electrode 115 are arranged to withstand a voltage of at least 500 V, preferably at least 2000 V, and, even more preferred, at least 5000 V with respect to each other. With a high voltage between the first electrode 105 and the correcting electrode 115, it is possible to control the rotational symmetry of strong focussing fields 110. Achieving such high voltage break through resistivity between electrodes so close to each other can be done by using known standard techniques well known in the art.

In FIGS. 2a-b, the correcting electrode 115 moves with the first electrode 105 when it becomes tilted in one or the other direction, since the correcting electrode 115 is rigidly fastened to the first electrode 105 through a mechanical structure which is not shown in the figures. Such design is mechanically easy to manufacture and to handle. Such design also is reproducible when it comes to the question what correcting electrode voltages Vc to take best at what landing angle 42.

However, a further design of the focussing lens according to the invention may include a correcting electrode 115 which is movable with respect to the first electrode 105. Such design is more complex since a motor may be needed to move the correcting electrode 115 with respect to the first electrode 105; however, the improvement for the focussing of the charged particle beam can be significant. For example, with a movable correcting electrode 115, the correcting electrode 115 can be moved out of the way when the focussing electrode 100 is operated at a perpendicular landing angle. This way, the full rotational symmetry is restored in order to obtain the best focussing quality. Similarly, a movable correcting electrode 115 provides two parameters, correcting electrode position and correcting electrode voltage Vc, to optimize the focussing. This greatly improves the flexibility to even further improve the focussing quality of the focussing lens.

The shape of the correcting electrode 115 of the FIGS. 2a-b, FIGS. 3A-D and FIG. 4 is only one out of many other possibilities that lie within the scope of the invention. The shape and position of the correcting electrode of FIG. 4 represents a best mode for operating the primary electron beam at a landing angle 42 of 45 degrees. If other landing angles 42 are preferred, it may well be that other shapes or positions of the first electrode 105 and the correcting electrode 115 are preferred. In this case, a person skilled in the art will know what electrode shape and positioning to take to obtain the focussing improvements according to the invention. He will also know that, the larger the covering angle 120 of the correcting electrode 115, the better the shielding of the focussing electric field 110 from a distortion from the specimen 3 or other external electric potential carrying structures. On the other hand, a person skilled in the art will also know that with a too large covering angle 120, the correcting electrode 115 may be in the way when the focussing lens 100 becomes tilted at a short working distance. Therefore, the covering angles 120 of the correcting electrode 115 should be selected according to the range of the landing angles 42 at which the focussing lens 100 is operated.

Another option for improving the focussing quality of the focussing lens according to the invention includes the use of a correcting electrode 115 which is segmented into two, three or even more electrode segments in order to apply different correcting electrode voltages Vc to each segment. The segmentation of the correcting electrode 115 also improves the flexibility for compensation for electric field distortions due to a tilted specimen at various landing angles 42.

The focussing lens according to the present invention preferably is part of a charged particle beam device, to inspect or structure a specimen at landing angles that deviate significantly from 90 degrees. For example, the focusing lens shown in FIGS. 2a-b and FIG. 4 may well be used for the SEM of FIGS. 1a-b. This way, it is possible to inspect a specimen with a combined magnetic-electrostatic lens at various landing angles at working distances of less than 2 mm.

The invention claimed is:

1. A focussing lens for focussing a charged particle beam onto a specimen at a predetermined landing angle, comprising: at least a first electrode having a first aperture to generate a focussing electric field for focussing the charged particle beam onto the specimen; and a correcting electrode having a cone-like shaped curved surface to compensate for landing angle dependent distortions of the focussing electric field, the distortions being caused by the specimen, wherein the cone-like shaped curved surface of the correcting electrode has an opening on a lateral surface between a base and an apex of the cone-like shaped surface to provide space for the specimen to approach the first electrode.

2. The focussing lens of claim 1, wherein the curved surface of the correcting electrode is aligned to be rotationally symmetric with respect to a symmetry axis of the first aperture.

3. The focussing lens of claim 1, wherein the curved surface of the correcting electrode encircles a symmetry axis by a covering angle of less than or equal to 350 degrees.

4. The focussing lens of claim 3, wherein the covering angle is taken within the plane of the first aperture.

5. The focussing lens of claim 1, wherein the curved surface of the correcting electrode encircles a symmetry axis by a covering angle of at least 10 degrees.

6. The focussing lens of claim 1, wherein the curved surface of the correcting electrode is rigidly fastened to the at least first electrode.

7. The focussing lens of claim 1, wherein the at least first electrode and the correcting electrode are electrically connected to different voltage sources to provide for different voltages.

8. The focussing lens of claim 1, wherein the first electrode is cone-like shaped.

9. The focussing lens of claim 8, wherein the curved surface of the correcting electrode is shaped and positioned to cover more than 20% of the cone-like shaped first electrode to electrostatically shield said cone-like shaped first electrode.

10. The focussing lens of claim 1, wherein the curved surface of the correcting electrode faces the first electrode conformally.

11. The focussing lens of claim 1, wherein a distance D1 between the at least one first electrode and the facing curved surface of the correcting electrode is smaller than 10 mm.

12. The focussing lens of claim 1, wherein the at least one first electrode and the correcting electrode are arranged to withstand a voltage of at least 500 V.

13. The focussing lens of claim 1, wherein the opening of the curved surface of the correcting electrode is large enough to accommodate the specimen closer to the at least one first electrode than a distance D1 between the first electrode and the curved surface of the correcting electrode.

14. The focussing lens of claim 1, wherein a rim of the opening in the curved surface of the correcting electrode defines essentially a parabola.

15. The focussing lens of claim 1, wherein the specimen is a planar semiconductor wafer having a diameter larger than 30 mm.

16. The focussing lens of claim 1, wherein a vertex angle of the cone-like shaped correcting electrode is within a range of 30 degrees and 160 degrees.

17. The focussing lens of claim 1, further comprising a coil for providing a focussing magnetic field for focussing the charged particle beam.

18. The focussing lens of claim 1, further comprising a second electrode having a second aperture for focussing the charged particle beam.

19. A charged particle beam device to inspect or structure a specimen at various predetermined landing angles, comprising: a charged particle beam source to generate a charged particle beam; and a focussing lens to focus the charged particle beam onto the specimen, the focussing lens comprising at least a first electrode having a first aperture to generate a focussing electric field for focussing the charged particle beam onto the specimen and a correcting electrode having a cone-like shaped curved surface to compensate for landing angle dependent distortions of the focussing electric field, the distortions being caused by the specimen, wherein the cone-like shaped curved surface of the correcting electrode has an opening on a lateral surface between a base and an apex of the cone-like shaped surface to provide space for the specimen to approach the first electrode.

20. The charged particle beam device of claim 19, further comprising a tilting mechanism to tilt a symmetry axis of the focussing lens with respect to the surface of the specimen for inspecting or structuring the specimen between at least two different landing angles.

21. The charged particle beam device of claim 20, wherein the tilting mechanism is capable of tilting the symmetry axis of the focussing lens to provide a vertical landing angle and a tilted landing angle which deviates from the vertical landing angle by at least 20.

22. The charged particle beam device of claim 20, wherein the tilting mechanism is capable of providing a tilted landing angle which is half the cone vertex angle of the cone-like shaped first electrode.

23. The charged particle beam device of claim 20, wherein the symmetry plane of the focussing lens is equal to or about equal to the tilting plane.

* * * * *

UNITED STATES PATENT AND TRADEMARK OFFICE
CERTIFICATE OF CORRECTION

PATENT NO.          : 7,652,263 B2                                              Page 1 of 1
APPLICATION NO.     : 10/587137
DATED               : January 26, 2010
INVENTOR(S)         : Feuerbaum It is certified that error appears in the above-identified patent and that said Letters Patent is hereby corrected as shown below:

Column 4, Line 45, please delete "VC" and insert --$V_c$-- therefor.

Signed and Sealed this

Sixth Day of April, 2010

David J. Kappos
*Director of the United States Patent and Trademark Office*